Jan. 12, 1971 S. L. STARGER 3,553,828

LEAD ASSEMBLY STRUCTURE FOR SEMICONDUCTOR DEVICES

Filed Nov. 22, 1967

INVENTOR
SAMUEL L. STARGER

BY [signature]

ATTORNEY

United States Patent Office 3,553,828
Patented Jan. 12, 1971

3,553,828
LEAD ASSEMBLY STRUCTURE FOR SEMICONDUCTOR DEVICES

Samuel L. Starger, Clark, N.J., assignor to RCA Corporation, a corporation of Delaware Filed Nov. 22, 1967, Ser. No. 685,095
Int. Cl. H01l 5/00
U.S. Cl. 29—589 1 Claim

ABSTRACT OF THE DISCLOSURE

A terminal assembly for mounting a semiconductor die containing a number of active regions. Conductive lands on a surface of the die are electrically connected to the active regions.

Figures 1A, 1B, 1C, 1D, 2A, 2B, 2C, 2D, 3:
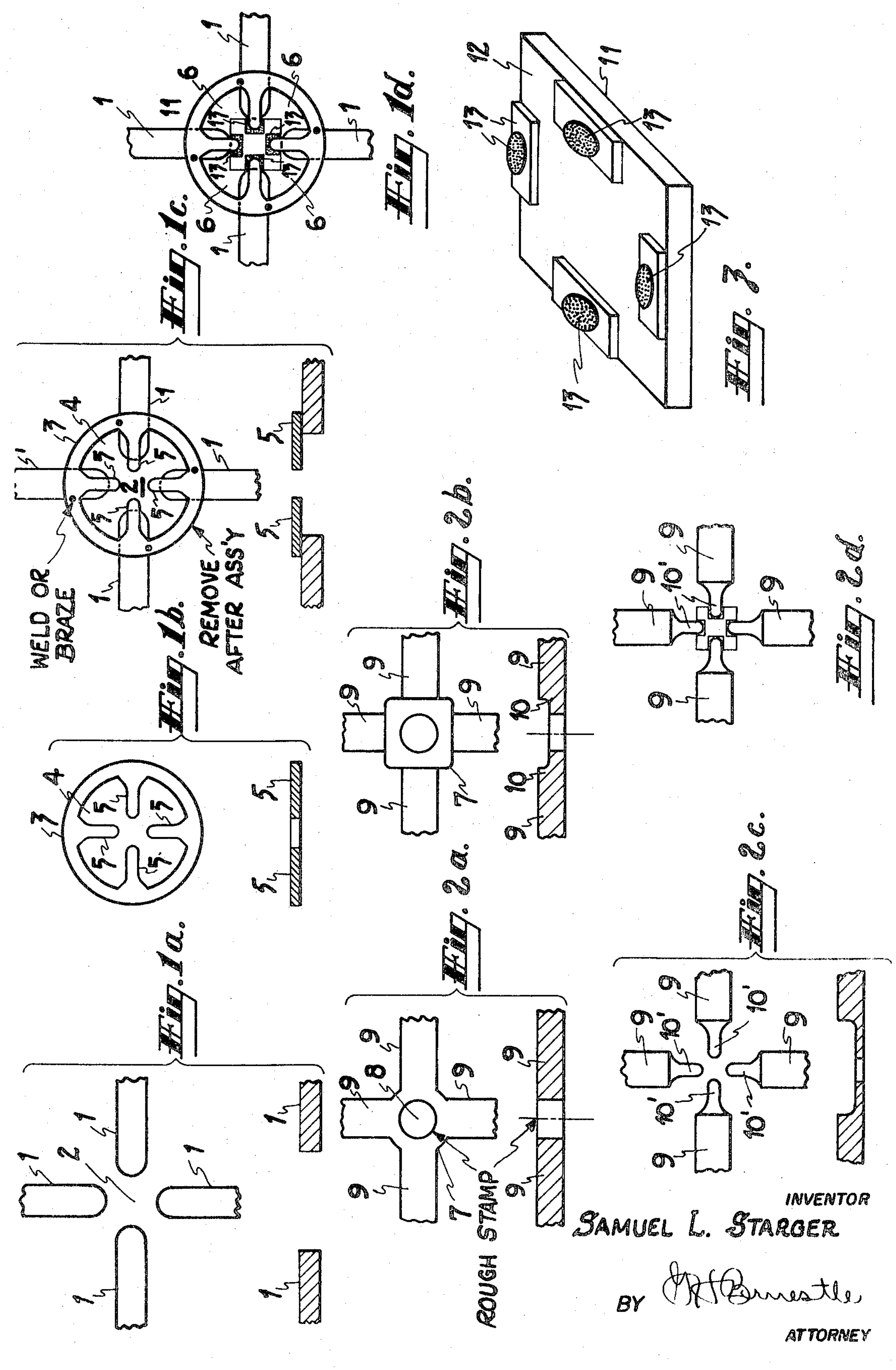

The terminal assembly consists of a number of relatively thick terminal leads extending radially outward from a common central area. Each terminal lead has a relatively thin end portion at the central area bonded directly to a corresponding land on the semiconductor die.

BACKGROUND OF THE INVENTION

This invention relates to terminal assemblies for semiconductor devices, and more particularly to an assembly and method for mounting and providing direct electrical connections to a semiconductor die.

In the manufacture of semiconductor devices in general, and integrated circuits in particular, difficulties arise in providing a suitable mounting arrangement for the very small die which contains the active semiconductor regions. The die may typically have dimensions on the order of 20 to 60 mils square, and may contain a large number (on the order of 10 to 28 or more) of extremely small conductive lands to which external electrical connections must be made. Integrated circuits presently being manufactured commonly have conductive lands on the order of 2 to 4 mils wide.

In order to provide a terminal assembly for the semiconductor die which can be conveniently handled and connected to similar assemblies or other components, it is common to mount the die in a package having a central area from which terminal leads (corresponding to conductive lands on the die) extend radially outward. A short, fine (on the order of 1 mil in diameter) segment of wire is employed to electrically connect each land to the adjacent end portion of the corresponding terminal lead.

Besides necessitating the making of two electrical connections for each device terminal (the larger the number of connections the lower the reliability of the resultant device), this assembly method requires a considerable amount of operator time and skill.

An improvement which may be considered is to eliminate the intermediate segment of wire connecting each die land to its corresponding terminal lead. It would, for example, be desirable to have the terminal leads extend inwardly to register with the corresponding lands on the die, so that each terminal lead could be directly bonded to the associated land without the use of an intermediate connecting wire.

However, difficulties arise in fabricating terminal leads which are sufficiently narrow to register with the lands, since practical manufacturing methods cannot economically provide terminal leads which have end portions of a width less than the lead thickness. Since the terminal leads must have a thickness on the order of 5 to 10 mils in order to retain sufficient mechanical strength for handling, and since the width of the lands on the semiconductor die may be one the order of 2 to 4 mils, it is evident that the direct connection of the terminal leads to the lands is not practicable.

An object of the present invention is to provide an improved terminal assembly in which each terminal lead is directly bondable to a corresponding land of a semiconductor die.

Another object of the invention is to provide an improved method for manufacturing such a terminal assembly.

SUMMARY

My invention provides a terminal assembly for a semiconductor device comprising a die having a number of active semiconductor regions. A surface of the die has a plurality of terminal lands each of which is electrically connected to at least one active semiconductor region.

The terminal assembly comprises a number of relatively thick metallic fingers extending outwardly from a central area in which the die is to be received. Each finger has a relatively thin end portion which is adapted to register with a corresponding land of the die.

IN THE DRAWING

FIGS. 1(*a*) through 1(*c*) show various steps in manufacturing a terminal assembly according to a preferred embodiment of my invention;

FIG. 1(*d*) shows a terminal assembly according to my invention in which a semiconductor device has been mounted;

FIGS. 2(*a*) through 2(*c*) show various steps in manufacturing a terminal assembly according to an alternative embodiment of my invention;

FIG. 2(*d*) shows a terminal assembly according to the alternative embodiment of my invention in which a semiconductor device has been mounted; and FIG. 3 shows a semiconductor device suitable for mounting in the terminal assembly of my invention.

DETAILED DESCRIPTION

A semiconductor device mounting assembly is prepared which comprises a plurality of leads having end portions of reduced dimensions. The first step in one embodiment of the method, illustrated in FIG. 1(*a*), is to assemble a plurality of metallic fingers 1 so that they extend inwardly toward an open central area 2.

The metallic fingers 1 may comprise a relatively ductile material of good electrical and thermal conductivity, such as copper. The metallic fingers have a thickness on the order of 5 to 10 mils in order to provide sufficient strength for handling and to prevent the inner end portions of the leads from being displaced from their proper positions.

In most cases it is desirable to fabricate the metallic fingers 1 as an integral assembly, in which a lead frame of the same material holds the fingers together as a unitary member. Such an arrangement is well known in the art and is shown, e.g., in U.S. Pat. No. 3,271,625.

An apertured support 3 of relatively thin metallic material having a thickness on the order of 1 to 2 mils is provided as the piece part shown in FIG. 1(*b*).

The support 3 has a central aperture 4. Four relatively thin metallic fingers 5 are connected to the support 3 and extend into the aperture 4. Each relatively thin metallic finger 5 corresponds to one of the relatively thick metallic fingers 1 and is adapted to register with the corresponding relatively thick metallic fingers when the support 3 is placed on the fingers 1 so that the aperture 4 communicates with the central area 2.

The metallic material comprising the support 3 may be a metal or alloy of good electrical and thermal conductivity and having suitable bonding properties. I prefer to employ Kovar as the material for the support 3 because of its good ultrasonic bonding qualities and the relatively close match between its coefficient of thermal expansion and that of the silicon material which is commonly employed for the semiconductor die to which the fingers 5 will ultimately be connected. Kovar is the trademark of Westinghouse Electric Corporation for an alloy having 29% by weight nickel, 17% by weight cobalt, and the remainder essentially iron.

In manufacturing the terminal assembly of my invention, the support 3 is placed on the fingers 1 so that each relatively thin finger 5 is adjacent a corresponding relatively thick finger 1. Each thin finger 5 is then welded, brazed or soldered to its corresponding thick finger 1, the resultant structure being as shown in FIG. 1(*c*).

At a later stage in the manufacturing process, either before or after the semiconductor die is mounted to the terminal assembly of FIG. 1(*c*), the support 3 is severed along the lines 6 (see FIG. 1(*d*)) to electrically isolate the composite fingers (each consisting of a relatively thick metallic finger 1 and an associated relatively thin metallic finger 5).

Rather than employ two-piece parts for the manufacture of my terminal assembly (as shown in FIGS. 1(*a*) through 1(*d*)) a single-piece part may be employed in conjunction with a relatively simple progressive die for stamping the desired structure.

FIG. 2(*a*) shows the initial piece part, which consists of a unitary metallic member 7 having a common metallic region 8 and four relatively thick metallic fingers 9 extending outwardly from the common region 8. The common region 8 contains a central hole which has been provided in order to allow the metal to flow during the subsequent stamping operation.

The common region 8 and the adjacent end portions of the relatively thick metallic fingers 9 is then stamped (or "coined") to reduce the thickness of the common area and the adjacent metallic finger portions. The resultant structure is shown in FIG. 2(*b*), which indicates that after this stamping step each relatively thick metallic finger 9 has a relatively thin end portion 10 (having a thickness on the order of 1 to 2 mils) adjacent the common region 8. The metal employed for the member 7 should be ductile and have good electrical and thermal conductivity. We prefer to employ Kovar as the metallic material in this embodiment.

After stamping the piece part to form the relatively thin finger end portions 10, a die is employed to reduce the width of the end portions and to isolate the end portions from each other. The resultant structure after severing these end portions from the common metallic region is shown in FIG. 2(*c*). It is seen that my completed terminal assembly now consists of a number of relatively thick and wide metallic fingers 9 each of which has a relatively thin and narrow end portion 10′.

A typical semiconductor device 11 suitable for mounting in the terminal assembly of my invention is shown in FIG. 3. The device 11 consists of a die of semiconductor material such as silicon, in which a number of active semiconductor regions (forming diodes, transistors, or other active elements) have been provided by diffusion, alloying or other techniques known in the art.

On one surface 12 of the device 11 there is provided a plurality (four in my preferred embodiment) of deposited metallic lands 13. Each land 13 has a raised portion comprising a "bump" of solder such as, e.g., tin or a gold-germanium eutectic alloy. Each of the lands 13 is provided in a position to register with a corresponding relatively thin finger end portion 5 or 10′ of my terminal assembly.

To assemble the semiconductor device 11 to the terminal assembly shown in FIG. 1(*c*), the semiconductor die is brought adjacent the central area 2 so that each relatively thin finger end portion 5 registers with a corresponding one of the lands 13. The resultant structure is then heated (preferably by a hot forming gas such as hydrogen) so that a solder connection is formed between each land 13 and its corresponding finger end portion 5.

Since the finger end portions 5 are of very thin material (on the order of 1 to 2 mils), it is not difficult to stamp or etch these portions to provide finger widths on the order of 2 mils (the approximate width of the lands 13).

The resultant structure, after the semiconductor device 11 has been mounted to the terminal assembly shown in FIG. 1(*c*), is shown in FIG. 1(*d*). The structure may now be severed along the lines 6 to electrically isolate the various metallic fingers 5.

In similar fashion the semiconductor device 11 may be mounted to the terminal assembly shown in FIG. 1(*c*), is shown in FIG. 1(*d*). The structure may now be severed along the lines 6 to electrically isolate the various metallic fingers 5.

In similar fashion the semiconductor device 11 may be mounted to the terminal assembly in FIG. 2(*c*), the resultant structure being as shown in FIG. 2(*d*).

Although I have shown the use of solder connections to bond the semiconductor device 11 to the relatively thin finger end portions of the corresponding terminal assemblies shown in FIGS. 1(*c*) and 2(*c*), other bonding methods may be employed. It is necessary only that the lands 13 and the corresponding finger end portions be bondable by the particular method used. For example, the conductive lands 13 may comprise aluminum and the finger end portions 5 and 10′ may be aluminum coated and ultrasonically bonded to the corresponding lands.

Since the lands 13 are essentially coplanar, it is desirable that the finger end portions 5 and 10′ also be coplanar in order to facilitate the use of production techniques to simultaneously bond the finger end portions to the corresponding lands. Where the bonding method is soldering, slight deviations from a coplanar configuration may be permissible since the solder "bumps" on the lands 13 soften or melt and may be depressed to a common level. In other cases the bonding machinery may possess means for bringing each finger end portion into engagement with the corresponding land.

My invention is especially useful where the width of each land on the semiconductor device 11 is less than about 6 mils, the terminal assembly of my invention being capable of having finger end portions of width and thickness both less than 6 mils.

What is claimed is:

1. A process for manufacturing a semiconductor device structure, comprising the steps of:

- providing a plurality of relatively thick cantilevered metallic fingers extending outwardly from a central open area;
- providing an apertured support having a corresponding plurality of relatively thin cantilevered metallic fingers extending into said aperture;
- bringing said support adjacent said relatively thick fingers so that said aperture is in communication with said central area, and each relatively thin finger is in registration with a corresponding relatively thick finger;
- bonding each relatively thin finger to the corresponding relatively thick finger to form a composite cantilevered finger;
- severing said support to electrically isolate each composite finger;
- providing a die having a corresponding plurality of electrically conductive lands for one surface thereof, said die having a number of active semiconductor regions, each land being electrically coupled to at least one of said active regions;
- aligning said die so that each land is adjacent a corresponding relatively thin end portion; and
- bonding each relatively thin end portion to the adjacent land.

(References on following page)

References Cited

UNITED STATES PATENTS

| | | | |
|---|---|---|---|
| 3,317,287 | 5/1967 | Caracciolo | 29—193 |
| 3,325,882 | 6/1967 | Chiou et al. | 29—155.5 |
| 3,340,348 | 9/1967 | Clark et al. | 174—52 |
| 3,341,649 | 9/1967 | James | 174—52 |
| 3,265,806 | 8/1966 | Burks et al. | 174—52 |
| 3,336,508 | 8/1967 | Preletz et al. | 317—101 |
| 3,431,629 | 3/1969 | Stroup et al. | 29—471.1 |
| 1,695,476 | 12/1928 | Winkler | 72—334 |
| 3,459,918 | 8/1969 | Rzant | 219—91 |
| 3,436,810 | 4/1969 | Kauffman | 29—577 |

JOHN W. HUCKERT, Primary Examiner

B. ESTRIN, Assistant Examiner

U.S. Cl. X.R.

317—234; 174—50.6